US012580025B2

(12) United States Patent
Khan et al.

(10) Patent No.: US 12,580,025 B2
(45) Date of Patent: Mar. 17, 2026

(54) ON-DIE CAPACITOR BANKS

(71) Applicant: Micron Technology, Inc., Boise, ID (US)

(72) Inventors: Mohammed A. Khan, Boise, ID (US); Michael Wagner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 18/442,943

(22) Filed: Feb. 15, 2024

(65) Prior Publication Data

US 2024/0282385 A1 Aug. 22, 2024

Related U.S. Application Data

(60) Provisional application No. 63/446,973, filed on Feb. 20, 2023.

(51) Int. Cl.
| | |
|---|---|
| *G11C 11/34* | (2006.01) |
| *G11C 16/20* | (2006.01) |
| *H01L 25/065* | (2023.01) |
| *H01L 25/18* | (2023.01) |
| *H10B 80/00* | (2023.01) |

(52) U.S. Cl.
CPC .......... *G11C 16/20* (2013.01); *H01L 25/0657* (2013.01); *H01L 25/18* (2013.01); *H10B 80/00* (2023.02); *H01L 2225/06506* (2013.01); *H01L 2225/06562* (2013.01)

(58) Field of Classification Search
CPC ..... G11C 16/20; H10B 80/00; H01L 25/0657; H01L 25/18; H01L 2225/06506; H01L 2225/06562

USPC ...................................................... 365/185.18
See application file for complete search history.

(56) References Cited

U.S. PATENT DOCUMENTS

| | | | | |
|---|---|---|---|---|
| 7,504,808 B2 * | 3/2009 | Schrom | ................. | H02M 7/068 |
| | | | | 323/272 |
| 8,040,174 B2 * | 10/2011 | Likhterov | ............... | H02M 3/07 |
| | | | | 327/59 |
| 8,368,369 B2 * | 2/2013 | Seeman | ................... | H02M 3/07 |
| | | | | 323/282 |
| 11,295,787 B1 * | 4/2022 | Gunther | ................. | G11C 5/147 |
| 11,677,259 B2 * | 6/2023 | Suljic | ..................... | G11C 5/141 |
| | | | | 320/166 |
| 12,135,595 B2 * | 11/2024 | Choudhury | ............... | G06F 1/30 |
| 2004/0120169 A1 * | 6/2004 | Schrom | ............... | H02M 3/1584 |
| | | | | 363/65 |
| 2006/0277422 A1 * | 12/2006 | Berke | .................... | G11C 5/141 |
| | | | | 713/300 |
| 2010/0008174 A1 * | 1/2010 | Sartore | ................. | G11C 16/10 |
| | | | | 365/228 |
| 2010/0202240 A1 * | 8/2010 | Moshayedi | ............ | G11C 16/30 |
| | | | | 365/228 |

(Continued)

*Primary Examiner* — Viet Q Nguyen
(74) *Attorney, Agent, or Firm* — Brooks, Cameron & Huebsch, PLLC

(57) ABSTRACT

A method includes dividing an on-die capacitor of a memory device into a plurality of capacitor banks, charging the plurality of capacitor banks sequentially during an initialization of the memory device, determining a supply voltage for the memory device is below a threshold voltage, and discharging the plurality of capacitor banks sequentially to provide power to the memory device in response to determining the supply voltage is below the threshold voltage.

19 Claims, 9 Drawing Sheets

(56)         References Cited

U.S. PATENT DOCUMENTS

| | | | |
|---|---|---|---|
| 2010/0332858 A1* | 12/2010 | Trantham ................ | G06F 1/263 |
| | | | 713/300 |
| 2012/0014169 A1* | 1/2012 | Snider ................... | G11C 5/141 |
| | | | 365/148 |
| 2014/0075233 A1* | 3/2014 | Bartling ............... | G06F 3/0679 |
| | | | 713/324 |
| 2017/0237276 A1* | 8/2017 | Onishi ...................... | H02J 7/04 |
| | | | 320/108 |
| 2018/0181184 A1* | 6/2018 | Ye ............................. | H02J 9/04 |
| 2018/0322011 A1* | 11/2018 | Batcheller ................ | H03K 5/00 |
| 2019/0277422 A1* | 9/2019 | Strasswiemer ..... | F16K 31/0693 |
| 2019/0371414 A1* | 12/2019 | Nguyen ................. | G11C 16/08 |
| 2023/0317773 A1* | 10/2023 | Shekhar .............. | H03H 1/0007 |
| | | | 257/534 |
| 2024/0170044 A1* | 5/2024 | Redaelli ................. | G11C 5/141 |
| 2024/0411334 A1* | 12/2024 | Lin ................... | G11C 13/0038 |

* cited by examiner

ON-DIE CAPACITOR BANKS

PRIORITY INFORMATION

This Application claims the benefit of U.S. Provisional Application No. 63/446,973, filed on Feb. 20, 2023, the contents of which are incorporated herein by reference.

TECHNICAL FIELD

Embodiments of the disclosure relate generally to memory sub-systems, and more specifically, relate to on-die capacitor banks.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
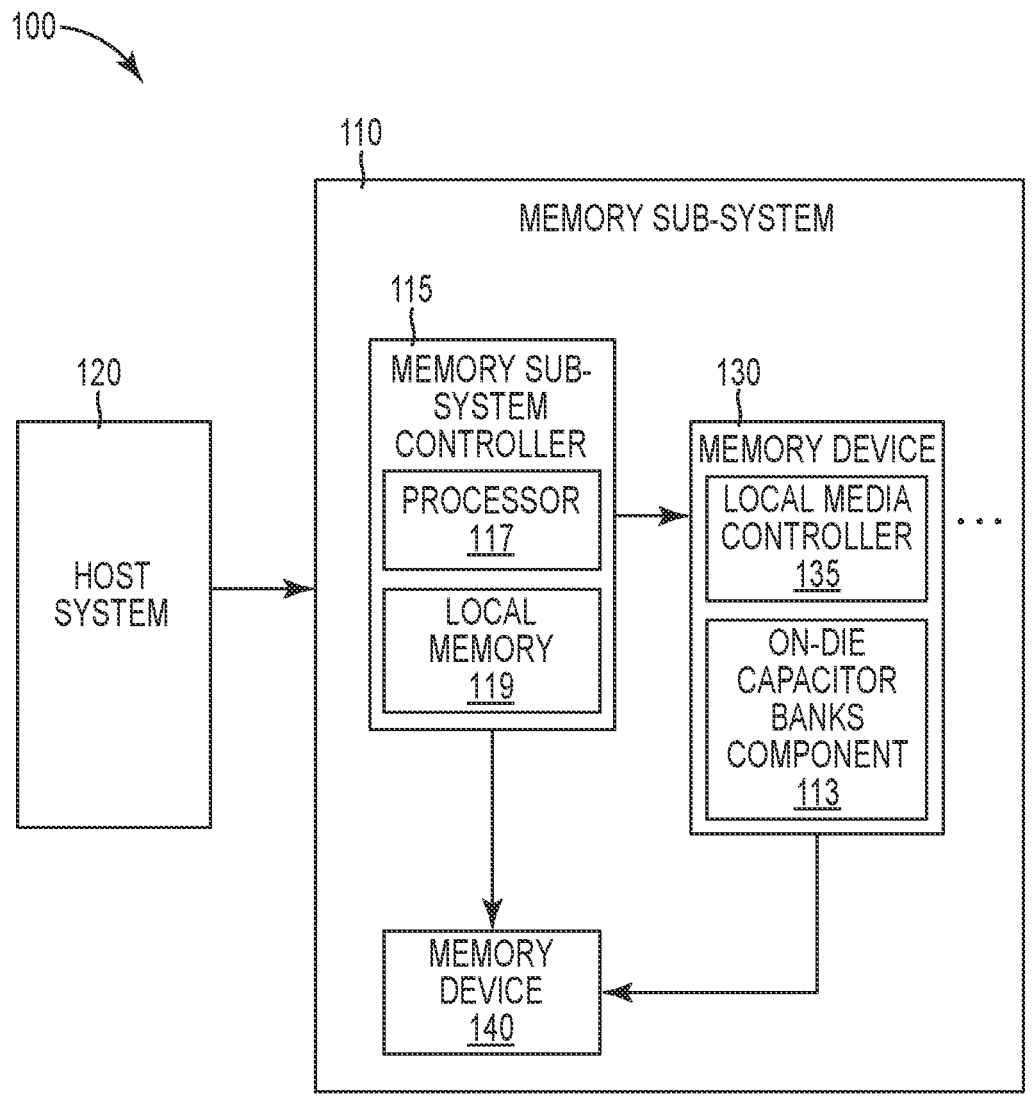
FIG. 1 illustrates an example computing system that includes a memory sub-system in accordance with some embodiments of the disclosure.

Aspects of the present disclosure are directed to charging and discharging on-die capacitor banks, in particular to memory sub-systems that include an on-die capacitor banks component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). As used herein, a NAND memory device can include either a set of flash memory dice or a combination of the flash memory dice and a non-volatile memory (NVM) controller. The NVM controller can include circuitry for performing read/write operations as described herein. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

In some previous approaches, memory devices can discharge an on-board capacitor to power the memory resource during a sudden drop in power below a power threshold and/or prior to or during a power off operation. As used herein, an on-board capacitor can be an electrical component used to store an electrical charge consisting of one or more pairs of conductors separated by an insulator that is positioned on a substrate. In this way, an on-board capacitor can be positioned on the surface of the substrate in a similar way as a plurality of memory dice are positioned on the surface of the substrate.

In these approaches the memory device can utilize the power from discharging the on-board capacitor to perform a power saving operation when a power source is no longer providing power to the memory device. A power saving operation can include operations to save data, state information, and/or metadata securely in case of power outage or sudden drop in power. In this way, the memory device can prevent data loss during a power outage or sudden drop in power. In some other approaches, batteries are utilized to store power (e.g., electricity, electrical power, etc.) that can be utilized by the memory device during a power outage or sudden drop in power. In some cases a battery can hold a greater quantity of power compared to a capacitor, but the capacitor is generally able to charge and discharge much faster than a battery.

In previous approaches, an on-board capacitor can be utilized on SSDs and/or NVDIMMs among other types of memory devices. In some examples, the on-board capacitors can be tantalum capacitors. A tantalum capacitor can consist of a pellet of porous tantalum metal that acts as an anode. The anode can be covered by an insulating oxide layer that forms the dielectric. The insulating oxide layer can be surrounded by liquid or solid electrolyte that can act as a cathode. In some examples, the greater a capacitance of the capacitor corresponds to a greater quantity of hold up time for the memory device to store data in response to a loss of power. As used herein, the hold up time refers to a quantity of time that the memory device is able to utilize back up power. For example, the hold up time for a memory device can refer to the quantity of time the memory device is able to operate while utilizing the on-board capacitor and/or on-die capacitor as described herein. In these examples, a greater quantity of hold up time can correspond to relatively less data corruption of the memory device.

Although capacitors can be discharged quickly to provide electrical power to the memory device and/or memory system, capacitors may be limited to a quantity of electrical charge storage compared to batteries or other power sources with a similar size. For example, a particular capacitor may only store a quarter of the electrical charge of a similarly sized lithium battery. In this way, an on-board capacitor can occupy a relatively larger space on the substrate of the memory device or memory system compared to a battery capable of providing a similar quantity of electrical power. In some previous examples, the on-board capacitor may also utilize additional electrical routing such as, but not limited to a voltage common collector (Vcc) and a ground (Gnd). Furthermore, the on-board capacitor can suffer from voltage decline over time whereby the on-board capacitor may become less effective at holding an electrical charge over time.

Aspects of the present disclosure address the above and other deficiencies by employing on-die capacitor banks. On-die capacitors can be silicon die capacitors that are positioned inside the memory device package. That is, the on-die capacitors can be trench capacitors that are positioned within a substrate of a memory device. For example, the on-die capacitors can be deep trench capacitors (DTC). As used herein, a DTC can be vertical semiconductor devices embedded within a substrate that are used to add capacitance to integrated circuits. That is, a DTC can be a capacitor formed within a deep trench of a substrate of the memory device. The term "deep trench" denotes a trench formed in a semiconductor substrate having a sufficient depth to form a capacitor. As such, a deep trench may typically denote a trench having a depth equal to or greater than 1 micron, whereas a shallow trench may typically refer to a trench having a depth less than 1 micron. While the present example may be described with a deep trench, the present example may be employed with a trench having any depth into the substrate.

The DTC can be divided into a plurality of capacitor banks. As used herein, a capacitor bank can be a portion of a capacitor that can be charged and/or discharged independently from other capacitor banks of the capacitor. In this way, the plurality of capacitor banks can be sequentially charged and/or discharged. For example, a plurality of capacitor banks can be charged individually such that a first capacitor bank is completely charged prior to charging a second capacitor bank. In a similar way, discharging the plurality of capacitor banks can include completely discharging a first capacitor bank prior to discharging a second capacitor bank.

Utilizing a plurality of capacitor banks can allow the DTCs of the memory device to be charged within defined initialization specifications (e.g., wake-up specifications, defined time limitations for initialization, etc.) of the memory device. For example, a power up time period during initialization can be defined by an Open NAND Flash Interface (ONFI) protocol. The ONFI protocol can define standards and specifications to be utilized for manufacturing computing components. In this way, utilizing the plurality of capacitor banks can allow the memory device to comply with the standards or specifications of the ONFI protocol. In addition, the plurality of capacitor banks can be sequentially discharged to provide electrical power to memory dice, switches, and/or other components associated with a memory device.

FIG. 1 illustrates an example computing system 100 that includes a memory sub-system 110 in accordance with some embodiments of the disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single-level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, a MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

As described above, the memory components can be memory dice or memory packages that form at least a portion of the memory device 130. In some embodiments, the blocks of memory cells can form one or more "super-blocks." As used herein, a "superblock" generally refers to a set of data blocks that span multiple memory dice and are written in an interleaved fashion. For instance, in some embodiments each of a number of interleaved NAND blocks can be deployed across multiple memory dice that have multiple planes and/or pages associated therewith. The terms "superblock," "block," "block of memory cells," and/or "interleaved NAND blocks," as well as variants thereof, can, given the context of the disclosure, be used interchangeably.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140. For instance, in some embodiments, the memory device 140 can be a DRAM and/or SRAM configured to operate as a cache for the memory device 130. In such instances, the memory device 130 can be a NAND.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device. The memory sub-system 110 can also include additional circuitry or components that are not illustrated.

The memory sub-system 110 can include an on-die capacitor banks component 113, which may be referred to in the alternative as a "controller," herein. Although not shown in FIG. 1 so as to not obfuscate the drawings, the on-die capacitor banks component 113 can include various circuitry to facilitate control of the on-die capacitor banks, as detailed herein. In some embodiments, the on-die capacitor banks component 113 can include special purpose circuitry in the form of an ASIC, FPGA, state machine, and/or other logic circuitry that can allow the on-die capacitor banks component 113 to orchestrate and/or perform the operations described herein.

In some embodiments, the memory sub-system controller 115 includes at least a portion of the on-die capacitor banks component 113. For example, the memory sub-system controller 115 can include a processor 117 (processing device) configured to execute instructions stored in local memory 119 for performing the operations described herein. In some embodiments, the on-die capacitor banks component 113 is part of the memory sub-system 110, an application, or an operating system. In a similar way, in other embodiments, the memory device 130 includes at least a portion of the on-die capacitor banks component 113.

In a non-limiting example, an apparatus (e.g., the computing system 100) can include an on-die capacitor banks component 113. The on-die capacitor banks component 113 can be resident on the memory sub-system 110. As used herein, the term "resident on" refers to something that is physically located on a particular component. For example, the on-die capacitor banks component 113 being "resident on" the memory sub-system 110 refers to a condition in which the hardware circuitry that comprises the on-die capacitor banks component 113 is physically located on the memory sub-system 110. The term "resident on" can be used interchangeably with other terms such as "deployed on" or "located on," herein.

Figure 2:
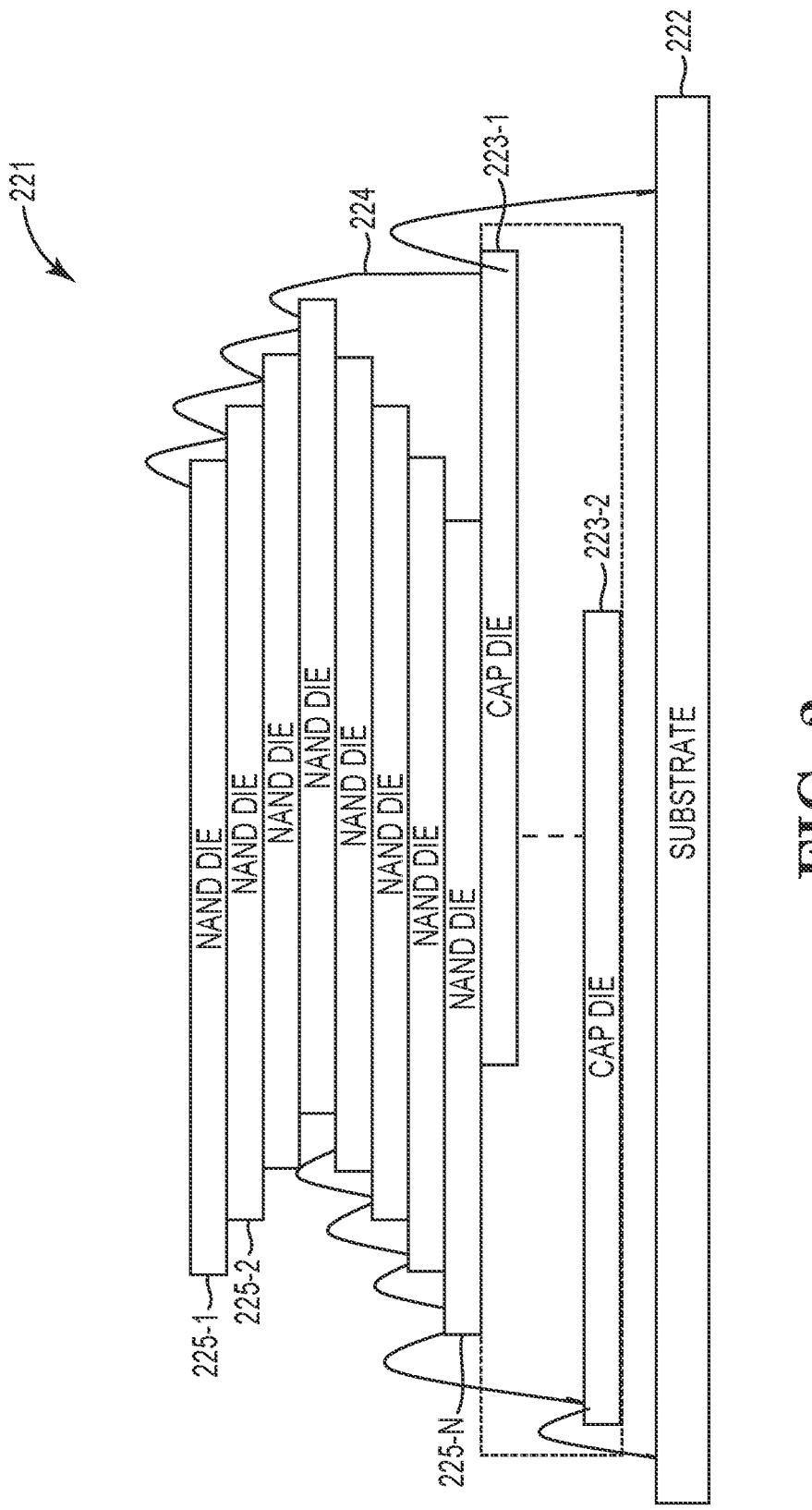
FIG. 2 illustrates a memory device that includes on-die capacitor banks in accordance with some embodiments of the disclosure.

As described further in reference to FIG. 2, the computing system 100 can include a capacitor die separated into a plurality of capacitor banks coupled to a power source via a switch. In some embodiments, the capacitor die is one or more DCTs embedded within a substrate. As described herein, the DCTs can be separated into a plurality of capacitors banks to allow the DCTs to be charged and discharged independently. For example, the DCTs can be physically separated into a plurality of capacitor banks. In addition, the computing system 100 can include a plurality of memory dice coupled to the power source and the capacitor die via the switch. In this way, the switch can be actuated in a first state to allow a power source (e.g., a power supply coupled to the host system 120, a power source coupled to the memory sub-system 110, etc.) to charge the plurality of capacitor banks and actuated in a second state to allow the plurality of capacitor banks to be discharged to provide electrical power to the memory device 130 and/or local media controller 135, among other components of the memory sub-system 110.

The on-die capacitor banks component 113 can be configured to charge (or cause charging of) the plurality of capacitor banks sequentially. As described further herein, the plurality of capacitor banks of a DCT or plurality of DCTs can be charged sequentially by a power source (e.g., a power supply coupled to the host system 120, a power source coupled to the memory sub-system 110, etc.). For example, a switch can be actuated to connect the DCT to a power source to allow the power source to charge the DCT. In this example, a time delay charging circuit can be utilized to sequentially charge the plurality of capacitor banks of the DCT such that a first capacitor bank is charged completely prior to beginning to charge a second capacitor bank. Charging the plurality of capacitor banks sequentially can allow the computing system 100 to comply with particular initialization requirements associated with the computing system 100.

In some embodiments, the DCT or plurality of DCTs can be split into a particular quantity of capacitor banks. For example, a DCT can be split into four capacitor banks. In this example, the four capacitor banks can be charged sequentially such that a first capacitor bank is charged prior to charging a second capacitor bank. In addition, a third capacitor bank can be charged upon completion of charging the second capacitor bank and the fourth capacitor bank can be charged upon completion of charging the third capacitor bank. In this way, the first, second, third, and fourth capacitor banks can be charged sequentially. Although a specific example is described using a total of four capacitor banks, additional or fewer capacitor banks can be utilized and/or the capacitor banks can be charged in any order.

The on-die capacitor banks component 113 can be configured to determine that a supply voltage from the power source is below a threshold voltage. In some embodiments, the on-die capacitor banks component 113 can determine when there is a power loss or drop in power being provided to the memory sub-system 110. For example, the host system 120 can be utilized to provide power to the components of the memory sub-system 110. When there is a loss of power or a drop in power provided by the host system 120, the on-die capacitor banks component 113 can initiate a data storage process to save data and metadata being stored on the memory device 130 to a different memory device (e.g., a different non-volatile or persistent memory device, etc.). In this way, the memory sub-system 110 can save data from being lost due to a loss in electrical power.

The on-die capacitor banks component 113 can be configured to actuate the switch to couple the capacitor die to the plurality of memory dice. As described herein, the switch can be utilized to couple the capacitor die to the host system 120 and/or power source to charge the capacitor die during an initialization. In these embodiments, the switch can be actuated to couple the capacitor die to the plurality of memory dice to allow the capacitor die to provide electrical power to the memory dice. As described herein, the capacitor die can be divided into a plurality of capacitor banks and discharged sequentially to provide the electrical power to the plurality of memory dice.

The on-die capacitor banks component 113 can be configured to discharge the plurality of capacitor banks sequentially to provide power to the plurality of memory dice through the switch. The on-die capacitor banks component 113 can be configured to connect the output of the plurality of capacitor banks to provide electrical power to the plurality of memory dice. As described further herein, the plurality of capacitor banks can be utilized to provide electrical power to the plurality of capacitor banks, the switch, and/or other components of the memory sub-system 110 such that data stored by the plurality of memory dice can be saved.

FIG. 2 illustrates a memory device 221 that includes on-die capacitor banks in accordance with some embodiments of the disclosure. The memory device 221 can be analogous to the memory device 130 of FIG. 1 and can include a substrate 222 that can be utilized as a foundation for a plurality of memory dice 225-1, 225-2, 225-N (e.g., NAND dice, etc.). In some embodiments, the substrate can be a semiconductor material such as silicon, metal oxide, or gallium arsenide (GaAs) that can be utilized to connect components (e.g., memory dice 225-1, 225-2, controllers, etc.) of the memory device 221.

In some embodiments, the substrate 222 can include capacitor dice 223-1, 223-2. As described herein, the capacitor dice 223-1, 223-2 can be DTCs that can be positioned within or embedded into the substrate 222. As described herein, a deep trench capacitor (DTC) comprises a deep trench in the substrate 222 (e.g., the semiconductor substrate of either a bulk silicon wafer or silicon-on-insulator (SOI) wafer). A doped region within in the substrate 222 adjacent to the trench forms one capacitor plate (i.e., a buried capacitor plate). A dielectric layer lining the trench forms the capacitor dielectric. Finally, a conductive fill material (e.g., a doped polysilicon) within the trench forms another capacitor plate. A standard contact can be formed to capacitor plate within the trench. However, a number of additional processing steps can be utilized to form the buried capacitor plate contact and the particular architecture shown in FIG. 2 is not intended to be limiting.

In this way, the DTC can be formed from a vertical trench that is formed from a top surface of the substrate 222 to an interior portion of the substrate 222. In this way, a DTC can decrease a footprint of components positioned on the surface of the substrate 222 compared to on-board capacitors. For example, the on-board capacitors of previous approaches can be positioned on a top surface of the substrate 222 while the DTCs of the present disclosure can be formed within the substrate 222. The capacitor dice 223-1, 223-2 can be coupled to the substrate 222 and/or coupled to the plurality of memory dice 225-1, 225-2, 225-N. As described further herein, the memory device 221 can include components such as switches, time delay charging circuits, among other components to couple the capacitor dice 223-1, 223-2 to the plurality of memory dice 225-1, 225-2, 225-N and/or a host device. In this way, the capacitor dice 223-1, 223-2 can be charged by the host device and discharged to provide electrical power to the plurality of memory dice 225-1, 225-2, 225-N.

Figure 3:
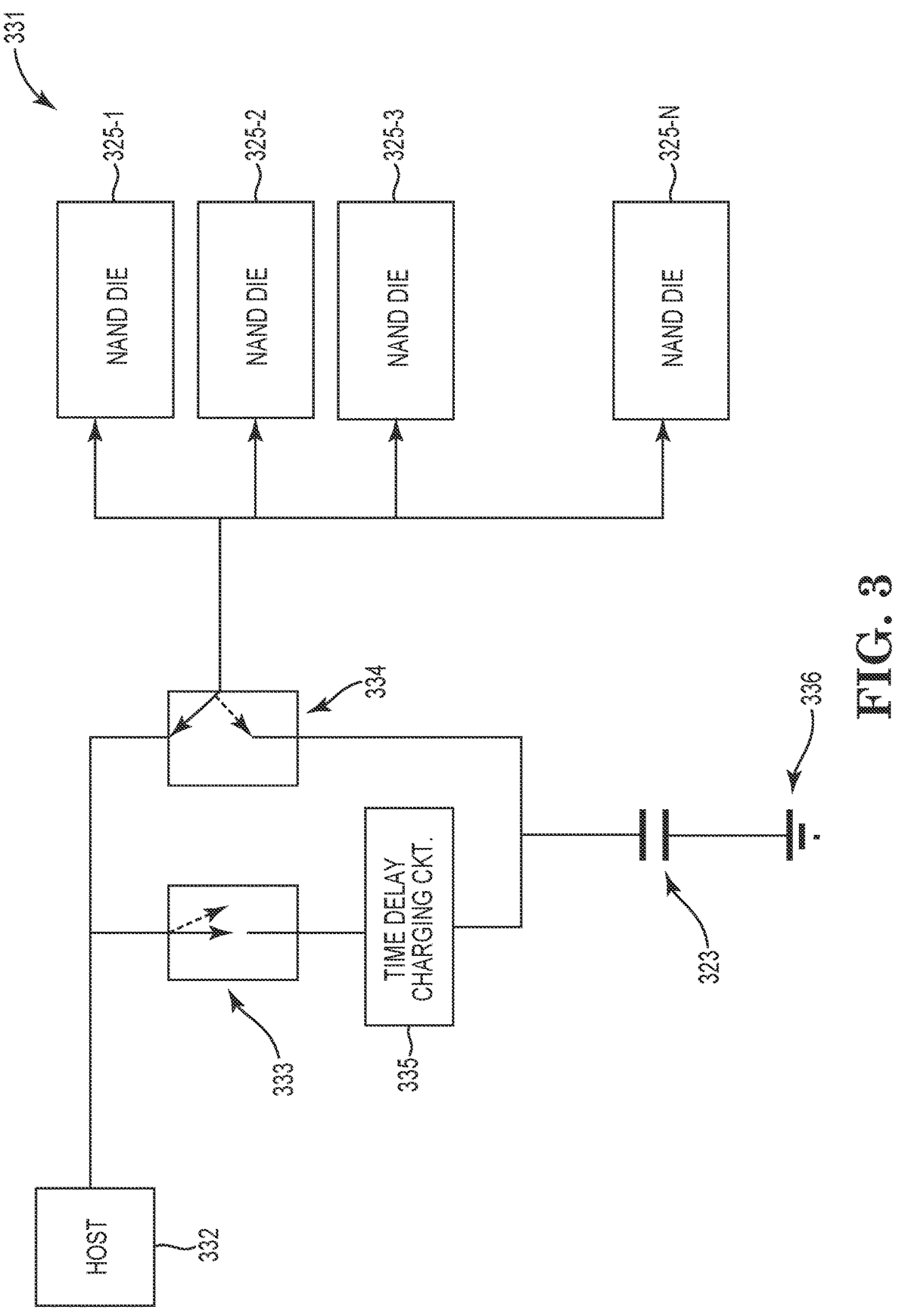
FIG. 3 illustrates a circuit diagram that can be utilized to sequentially discharge on-die capacitor banks in accordance with some embodiments of the disclosure.

FIG. 3 illustrates a circuit diagram 331 that can be utilized to sequentially discharge on-die capacitor banks 323 in accordance with some embodiments of the disclosure. The circuit diagram 331 can be one example of a circuit that can be utilized by a memory device (e.g., the memory device 130 of FIG. 1) to sequentially discharge or charge the on-die capacitor banks 323. As described herein, the on-die capacitor banks 323 can be formed from deep trench capacitors (DTCs) within a substrate of a memory device. For example, the on-die capacitor banks 323 can be a plurality of divided portions of the DTCs. In this way, the on-die capacitor banks 323 can be individually charged and discharged. In some embodiments, the circuit diagram 331 includes a ground 336 coupled to the on-die capacitor banks 323.

The circuit diagram 331 illustrates a host 332. The host 332 can be a host system (e.g., the host system 120 of FIG. 1) that can be in communication with the plurality of memory dice 325-1, 325-2, 325-3, 325-N. The host 332 can provide electrical power to the on-die capacitor banks 323 to charge the on-die capacitor banks 323. The circuit diagram 331 illustrates a host 332 that is coupled to the on-die capacitor banks 323 through a first switch 333. The first switch 333 can be an electrical switch that can connect or disconnect a conduction path of an electrical circuit. In some examples, the first switch 333 can be powered by the host 332 to actuate the first switch 333 to connect the conduction path between the host 332 and a time delay charging circuit 335 and/or the on-die capacitor banks 323. In this way, the host 332 can actuate the first switch 333 to begin charging the on-die capacitor banks 323. As described herein, the on-die capacitor banks 323 can be charged sequentially utilizing the time delay charging circuit 335.

In some embodiments, the host 332 (and/or the on-die capacitor banks component 113) can actuate the first switch 333 to an open position to disconnect the conduction path between the host 332 and the time delay charging circuit 335 and/or the on-die capacitor banks 323 when the on-die capacitor banks 323 have each been charged. In some embodiments, the host 332 can actuate the first switch 333 to close the circuit to connect the conduction path during an initialization of a memory device and actuate the first switch 333 to open the circuit to disconnect the conduction path after the initialization.

In some embodiments, the host 332 is coupled to a plurality of memory dice 325-1, 325-2, 325-3, 325-N. The host 332 can be a host device that includes a power source to provide electrical power to the plurality of memory dice 325-1, 325-2, 325-3, 325-N through a second switch 334. In some embodiments, the host 332 (and/or the on-die capacitor banks component 113) can actuate the second switch 334 to close the circuit to connect the conduction path between the host 332 and the plurality of memory dice 325-1, 325-2, 325-3, 325-N. In this way, the host 332 (and/or the on-die capacitor banks component 113) is able to communicate with the plurality of memory dice 325-1, 325-2, 325-3, 325-N and/or provide electrical power to the plurality of memory dice 325-1, 325-2, 325-3, 325-N.

As described herein, a controller (e.g., the on-die capacitor banks component 113) can determine when a voltage provided by the host 332 falls below a threshold voltage. In this way, the controller can be utilized to determine when the host 332 is not able to provide electrical power to the plurality of memory dice 325-1, 325-2, 325-3, 325-N. For example, the host 332 can experience a sudden loss of power and is not able to provide electrical power to the plurality of memory dice 325-1, 325-2, 325-3, 325-N. In these examples, the controller can instruct the on-die capacitor banks 323 to discharge. In some embodiments, the electrical power discharged from the on-die capacitor banks 323 can be utilized to operate the second switch 334. For example, the electrical power discharging from one or more of the on-die capacitor banks 323 can allow the controller to actuate the second switch 334. As described further herein, the electrical power discharging from one or more of the on-die capacitor banks 323 can be utilized to power the controller.

As described herein, the on-die capacitor banks 323 can be formed within one or more DTCs. In this way, the on-die capacitor banks 323 can act as a plurality of individual capacitors within each of a plurality of DTCs. In this way, the on-die capacitor banks 323 can be charged sequentially by the host 332 such that each of the plurality of on-die capacitor banks 323 of the DTCs can be charged individually in a particular order defined by the time delay charging circuit 335. For example, a first on-die capacitor bank 323 of a first DTC can be charged completely prior to charging a second on-die capacitor bank of the first DTC. This can be performed until each of a plurality of on-die capacitor banks 323 of the first DTC is completed. In a similar way, the on-die capacitor banks 323 can be discharged sequentially such that the first on-die capacitor bank 323 of the first DTC can be discharged completely prior to discharging the second on-die capacitor bank 323 of the first DTC. This can be performed sequentially until each of the plurality of on-die capacitor banks 323 of the first DTC are discharged.

Figure 4:
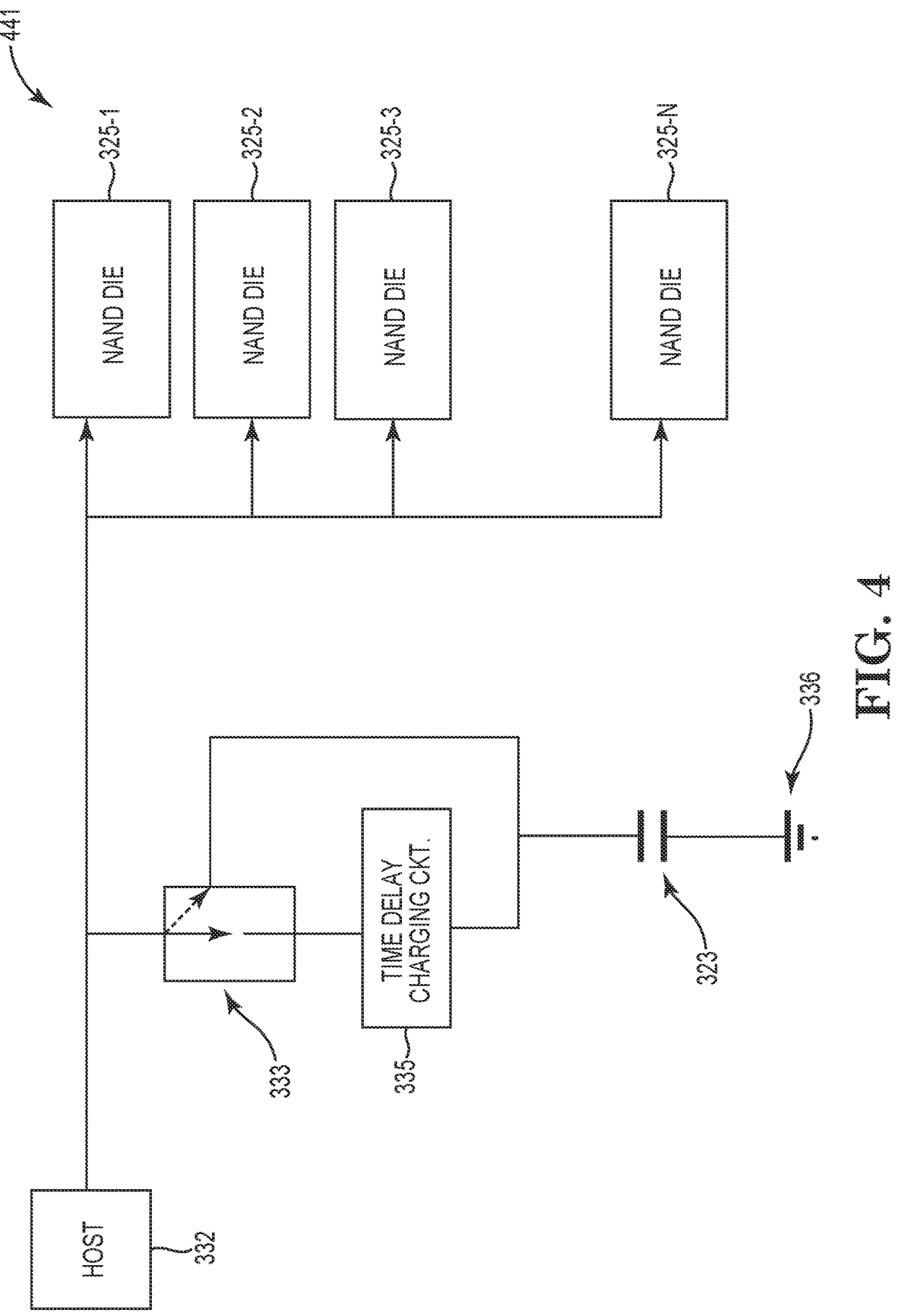
FIG. 4 illustrates a circuit diagram that can be utilized to sequentially discharge on-die capacitor banks in accordance with some embodiments of the disclosure.

FIG. 4 illustrates a circuit diagram 441 that can be utilized to sequentially discharge on-die capacitor banks 323 in accordance with some embodiments of the disclosure. The circuit diagram 441 can be one example of a circuit that can be utilized by a memory device to sequentially discharge or chare the on-die capacitor banks 323. The circuit diagram 441 can include the same or similar components as the circuit diagram 331. For example, the circuit diagram 441 can include a host 332 that is coupled to a first switch 333 that can electrically connect the host 332 to the time delay charging circuit 335 and/or the on-die capacitor banks 323. In these embodiments, the on-die capacitor banks 323 can be connected to a ground 336.

In some embodiments, the circuit diagram 441 may not include a second switch (e.g., second switch 334 as referenced in FIG. 3, etc.). For example, the first switch 333 can be utilized to electrically connect the host 332 to the on-die capacitor banks 323 in when actuated to a first state and electrically connect the on-die capacitor banks 323 to the plurality of memory dice 325-1, 325-2, 325-3, 325-N.

Figure 5:
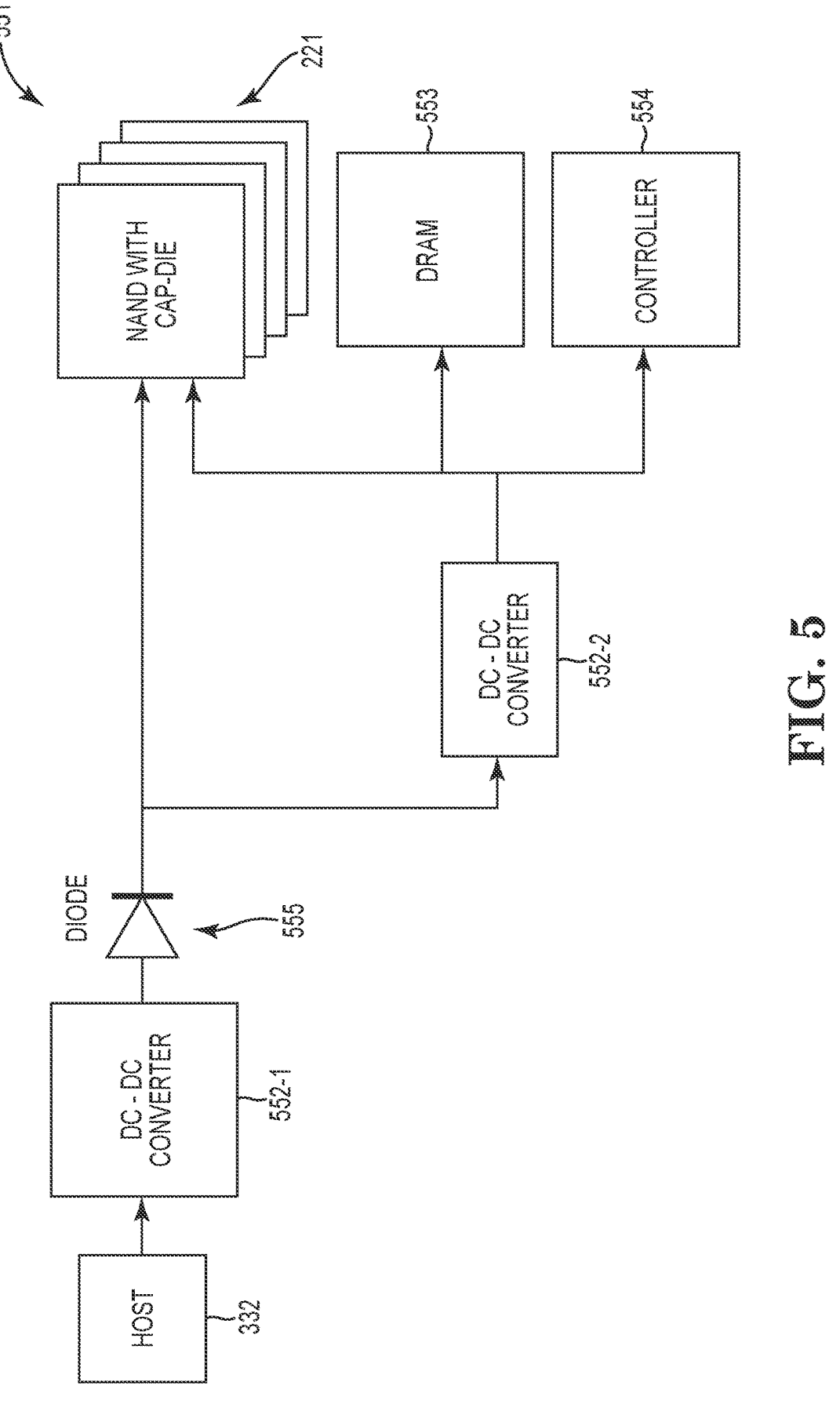
FIG. 5 illustrates a circuit diagram that can be utilized to sequentially discharge on-die capacitor banks in accordance with some embodiments of the disclosure.

FIG. 5 illustrates a circuit diagram 551 that can be utilized to sequentially discharge on-die capacitor banks in accordance with some embodiments of the disclosure. The circuit diagram 551 can be one example of a circuit that can be utilized by a memory system to sequentially discharge or chare the on-die capacitor banks of a memory device 221. The circuit diagram 551 can include the same or similar components as circuit diagram 441 as referenced in FIG. 4 and/or circuit diagram 331 as referenced in FIG. 3. For example, the host 332 can provide electrical power to a memory device 221. The memory device 221 can include the same components of the memory device 221 as referenced in FIG. 2. The memory device 221 can include NAND memory dice with on-die capacitor banks of a DTCs of a substrate.

In some embodiments, the host 332 can provide electrical power to a first direct current (DC)-DC converter 552-1. As used herein, a DC-DC converter can include an electronic circuit or electromechanical device that converts a source of direct current (DC) from a first voltage level to a second voltage level that is different than the first voltage level. The first DC-DC converter 552-1 can convert an input voltage (e.g., 5 Volts (V), etc.) from the host 332 to a first output voltage (e.g., 3.3 V, etc.). The first output voltage can be provided to a portion of the memory device 221 and to an input of a second DC-DC converter 552-2. The second DC-DC converter 552-2 can convert the input voltage from the first DC-DC converter 552-1 to a second output voltage (e.g., 1.2 V, etc.). The second output voltage can be provided to a controller 554, a DRAM 553, and/or a portion of the memory device 221.

In some embodiments, the circuit diagram 551 includes a diode 555 that is positioned between the first DC-DC converter 552-1 and the memory device. In these embodiments, the diode 555 is also positioned between the first DC-DC converter 552-1 and the second DC-DC converter 552-2. As used herein, a diode 555 includes a two-terminal electronic component that conducts current primarily in one direction (asymmetric conductance). For example, the diode 555 has relatively low (ideally zero) resistance in one direction, and relatively high (ideally infinite) resistance in the other. In some embodiments, the diode 555 allows the electrical power from the first DC-DC converter 552-1 to the memory device 221 and the second DC-DC converter 552-2 with relatively low resistance. In addition, the diode 555 can provide relatively high resistance from the on-die capacitor banks of the memory device 221 to the first DC-DC converter 552-1.

In some embodiments, the controller 554 (e.g., the on-die capacitor banks component 113) can determine when the host 332 is no longer able to provide electrical power to the memory device 221 and/or the second DC-DC converter 552-2. In these embodiments, the controller 554 can instruct the on-die capacitor banks to discharge electrical power to power the NAND dice and provide electrical power to the input of the second DC-DC converter 552-2. In these embodiments, the diode 555 can prevent the electrical power from the on-die capacitor banks from reaching the output of the first DC-DC converter 552-1. In this way, the discharging electrical power from the on-die capacitor banks can power the NAND dice of the memory device 221 and other components such as the DRAM 553, controller 554, and/or other components of the memory device 221.

Figure 6:
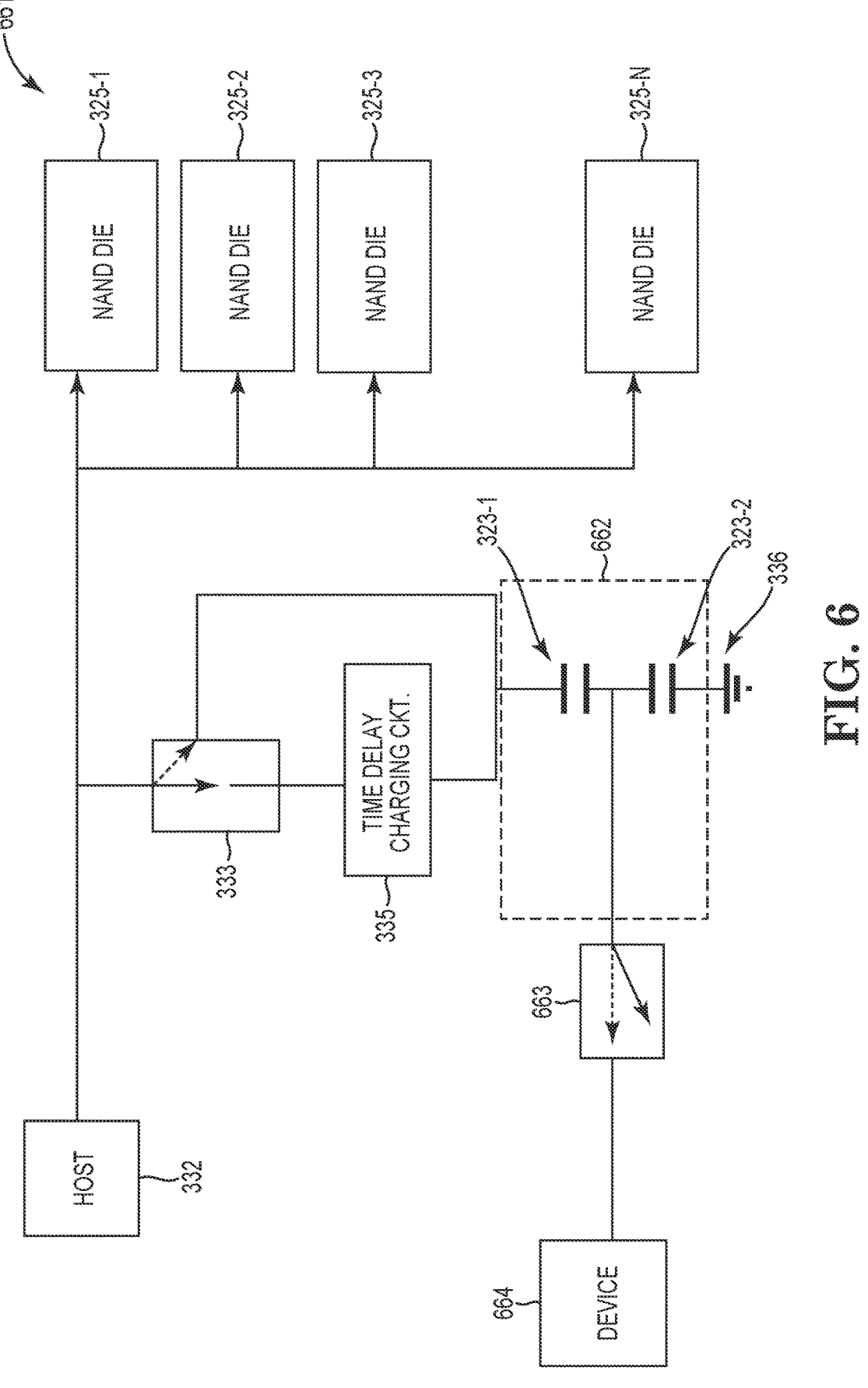
FIG. 6 illustrates a circuit diagram that can be utilized to sequentially discharge on-die capacitor banks in accordance with some embodiments of the disclosure.

FIG. 6 illustrates a circuit diagram 661 that can be utilized to sequentially discharge on-die capacitor banks 323-1, 323-2 in accordance with some embodiments of the disclosure. The circuit diagram 661 can include the same or similar components as the circuit diagram 331 as referenced in FIG. 3, the circuit diagram 441 as referenced in FIG. 4, and/or the circuit diagram 551 as referenced in FIG. 5. For example, the circuit diagram 661 includes a host 332 that is coupled to a plurality of memory dice 325-1, 325-2, 325-3, 325-N and/or a first switch 333. As described herein, the host 332 can provide electrical power to the plurality of memory dice 325-1, 325-2, 325-3, 325-N and to a first end of the first switch 333. The first switch 333 can connect an electrical connection between the host 332 and a time delay charging circuit 335 and/or the on-die capacitor banks 323-1, 323-2. In a similar way, the on-die capacitor banks 323-1, 323-2 can be coupled to a ground 336.

In these embodiments, the circuit diagram 661 can include a capacitive voltage divider 662. As used herein, a capacitive voltage divider 662 is one kind of voltage divider circuit where capacitors are used as the voltage-dividing components. Similar to resistors, capacitors can also be used to form a voltage divider circuit so that voltage can be separated into parts of a circuit based on the capacitor value. Similar to a voltage divider circuit using resistors, capacitors are connected in series to form a voltage divider network with a voltage source. In some embodiments, the output of the capacitive voltage divider 662 can be connected to a third switch 663.

The third switch can control a connection between the capacitive voltage divider 662 and a device 664. In some embodiments, the capacitive voltage divider 662 can be utilized to alter the output voltage instead of utilizing a DC-DC converter (e.g., second DC-DC converter 552-2 as referenced in FIG. 5, etc.). In some embodiments, the device 664 can be a system of devices that can be powered by the output of capacitive voltage divider 662. In a specific example, the device 664 includes a controller (e.g., controller 554 as referenced in FIG. 5, etc.), DRAM (e.g., DRAM 553 as referenced in FIG. 5, etc.) and/or other components. In some embodiments, the capacitive voltage divider 662 can be utilized to alter a discharging voltage (e.g., 3.3 V, etc.) from the on-die capacitor banks 323-1, 323-2 to an altered voltage (e.g., 1.2 V, etc.) to be utilized by the device 664.

Similar to the circuit diagram 441 as referenced in FIG. 4, the on-die capacitor banks 323-1, 323-2 can be utilized to provide electrical power to the plurality of memory dice 325-1, 325-2, 325-3, 325-N through the first switch 333 when a controller actuates the first switch 333 to connect the output of the on-die capacitor banks 323-1, 323-2 to the plurality of memory dice 325-1, 325-2, 325-3, 325-N.

Figure 7:
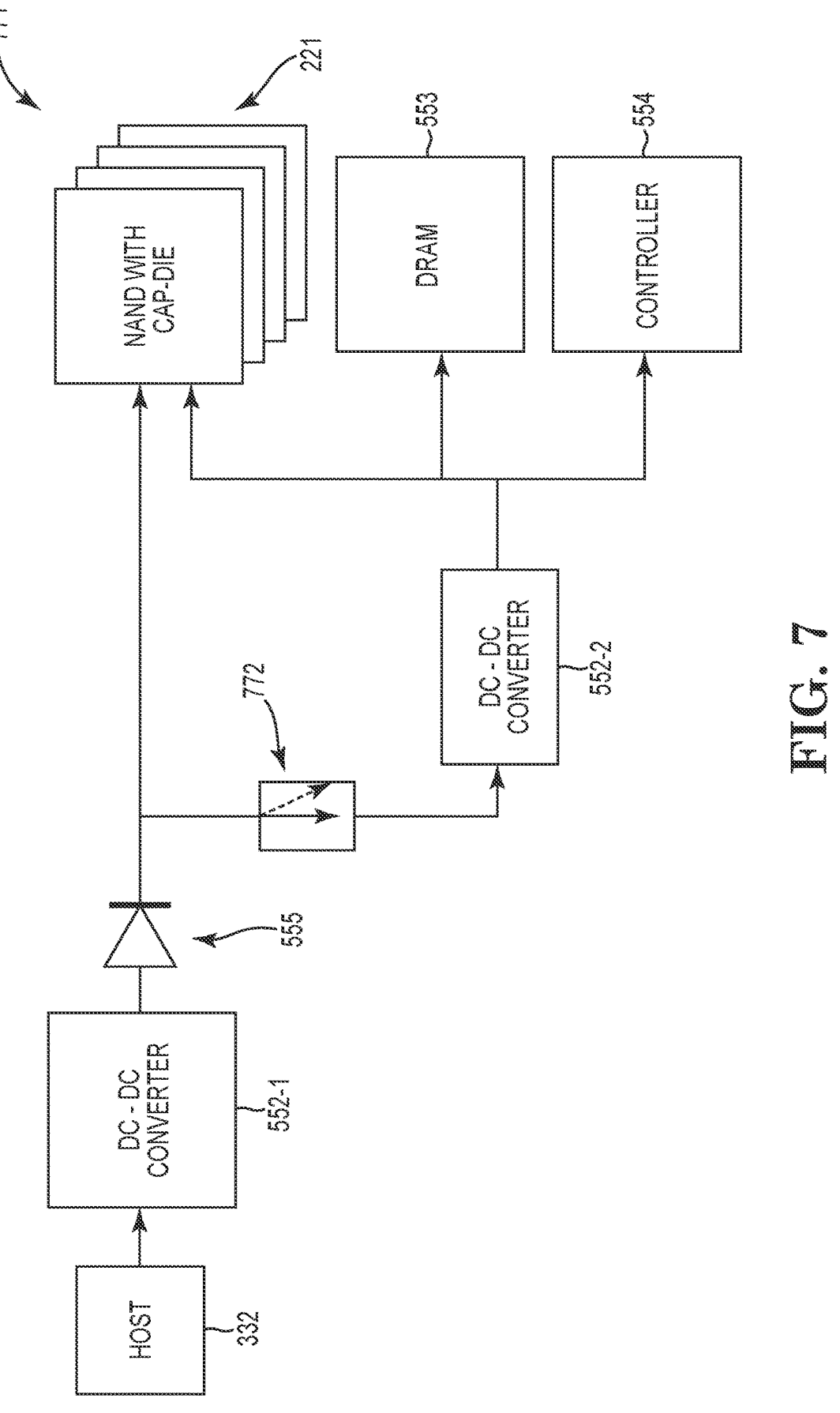
FIG. 7 illustrates a circuit diagram that can be utilized to sequentially discharge on-die capacitor banks in accordance with some embodiments of the disclosure.

FIG. 7 illustrates a circuit diagram 771 that can be utilized to sequentially discharge on-die capacitor banks in accordance with some embodiments of the disclosure. The circuit diagram 771 can include the same or similar components as circuit diagram 551 as referenced in FIG. 5.

In some embodiments, the host 332 can provide electrical power to a first direct current (DC)-DC converter 552-1. The first DC-DC converter 552-1 can convert an input voltage (e.g., 5 Volts (V), etc.) from the host 332 to a first output voltage (e.g., 3.3 V, etc.). The first output voltage can be provided to a portion of the memory device 221 and to an input of a second DC-DC converter 552-2. The second DC-DC converter 552-2 can convert the input voltage from the first DC-DC converter 552-1 to a second output voltage (e.g., 1.2 V, etc.). The second output voltage can be provided to a controller 554, a DRAM 553, and/or a portion of the memory device 221.

In these embodiments, a fourth switch 772 can be positioned between the first DC-DC converter 552-1 and the second DC-DC converter 552-2. In this way, the fourth switch 772 can be utilized to bypass the second DC-DC converter 552-2 when a capacitive voltage divider (e.g., capacitive voltage divider 662 as referenced in FIG. 6, etc.) is utilized by the memory device 221. In these embodiments, the capacitive voltage divider of the memory device 221 can be coupled to the DRAM 553 and/or the controller 554 and bypass the second DC-DC converter 552 by actuating the fourth switch 772. Similar to other switches described herein, the fourth switch 772 can be powered by the discharging on-die capacitor banks of the memory device 221.

In some embodiments, the circuit diagram 771 includes a diode 551 that is positioned between the first DC-DC converter 552-1 and the memory device 221. As described herein, the diode 551 can prevent the electrical power discharging from the on-die capacitor banks of the memory device 221 from reaching the output of the first DC-DC converter 552-1.

In some embodiments, the controller 554 can determine when the host 332 is no longer able to provide electrical power to the memory device 221 and/or the second DC-DC converter 552-2. In these embodiments, the controller 554 can instruct the on-die capacitor banks to discharge electrical power to power the NAND dice and provide electrical power to the fourth switch 772 such that the controller 554 can open the circuit and disconnect the connection between the memory device 221 and the second DC-DC converter 552-2. In this way, the discharging electrical power from the on-die capacitor banks can power the NAND dice of the memory device 221 and other components such as the DRAM 553, controller 554, and/or other components of the memory device 221.

Figure 8:
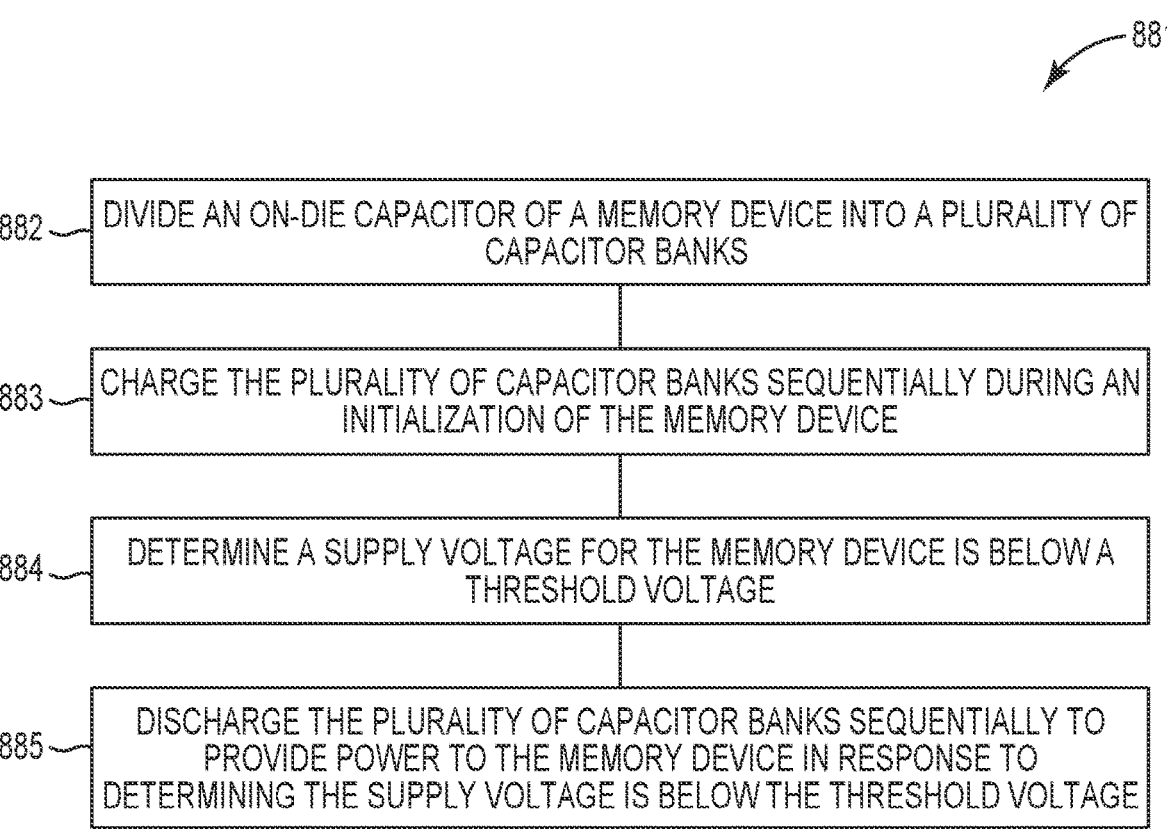
FIG. 8 is a flow diagram corresponding to a method for sequentially discharging on-die capacitor banks in accordance with some embodiments of the disclosure.

FIG. 8 is a flow diagram corresponding to a method 881 for sequentially discharging on-die capacitor banks in accordance with some embodiments of the disclosure. The method 881 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 881 is performed by the on-die capacitor banks component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 882, the method 881 can be executed to divide an on-die capacitor of a memory device into a plurality of capacitor banks. As described herein, the on-die capacitor of a memory device can be a DTC that is embedded within a substrate of a memory device. In these embodiments, the DTC can be divided into a plurality of capacitor banks. As used herein, a capacitor bank is a portion of a capacitor. For example, a capacitor bank can be a portion or divided area of a DTC of a memory device. In this way, the plurality of capacitor banks of the DTC can be charged and discharged individually and/or sequentially such that each of the plurality of capacitor banks can be utilized as individually capacitors instead of a single DCT capacitor.

At operation 883, the method 881 can be executed to charge the plurality of capacitor banks sequentially during an initialization of the memory device. As described herein, the plurality of capacitor banks can be charged and/or discharged individually. In this way, the plurality of capacitor banks can be charged sequentially by a host device or other type of power source. In some embodiments, the plurality of capacitor banks can be charged sequentially or in a particular order such that a first capacitor bank is completely charged prior to charging a second capacitor bank.

As described herein, charging the plurality of capacitor banks can include completing a charging of a first capacitor bank of the plurality of capacitor banks prior to starting a charging of a second capacitor bank of the plurality of capacitor banks. In some embodiments, the method 881 includes providing power, via the supply voltage, to the memory device while simultaneously charging the plurality of capacitor banks sequentially during an initialization of the memory device. In this way, none of the plurality of capacitor banks are simultaneously charged.

At operation 884, the method 881 can be executed to determine a supply voltage for the memory device is below a threshold voltage. As described herein, determining a supply voltage is below a threshold voltage can be a determination that a host or power source voltage that is being provided to the memory device is not able to power the memory device. That is, determining the supply voltage being below a threshold voltage can be an indication that the host has lost power or is unable to provide power to the memory device. In this way, it can be determined that a power save operation is to be performed by the memory device and that backup power is to be utilized to allow the memory device to store data to a different location so as to not lose or corrupt data stored by the memory device.

At operation 885, the method 881 can be executed to discharge the plurality of capacitor banks sequentially to provide power to the memory device in response to determining the supply voltage is below the threshold voltage. As described herein, the plurality of capacitor banks can be treated as individual capacitor devices. In this way, the plurality of capacitor banks can be discharged individually until each of the plurality of capacitor banks are discharged. In some embodiments, a first capacitor bank is completely discharged prior to discharging a second capacitor bank. In this way, none of the plurality of capacitor banks are simultaneously discharged.

In some embodiments, the method 881 includes discharging the plurality of capacitor banks sequentially to provide power to a controller of the memory device. In some embodiments, discharging the plurality of capacitor banks includes providing power to a switch associated with the on-die capacitor. In some embodiments, providing power to the switch includes opening the switch between the supply voltage and the memory device. In some of these embodiments, providing power to the switch includes closing the switch between the plurality of capacitor banks and the memory device.

As described herein, the plurality of capacitor banks can provide electrical power to other devices. In some embodiments a converter such as a DC-DC converter can be utilized to alter an output voltage of the plurality of capacitor banks prior to providing the electrical power to the other devices. In other embodiments, a capacitive voltage divider can be utilized to alter an output voltage of the plurality of capacitor banks prior to providing the electrical power to the other devices.

Figure 9:
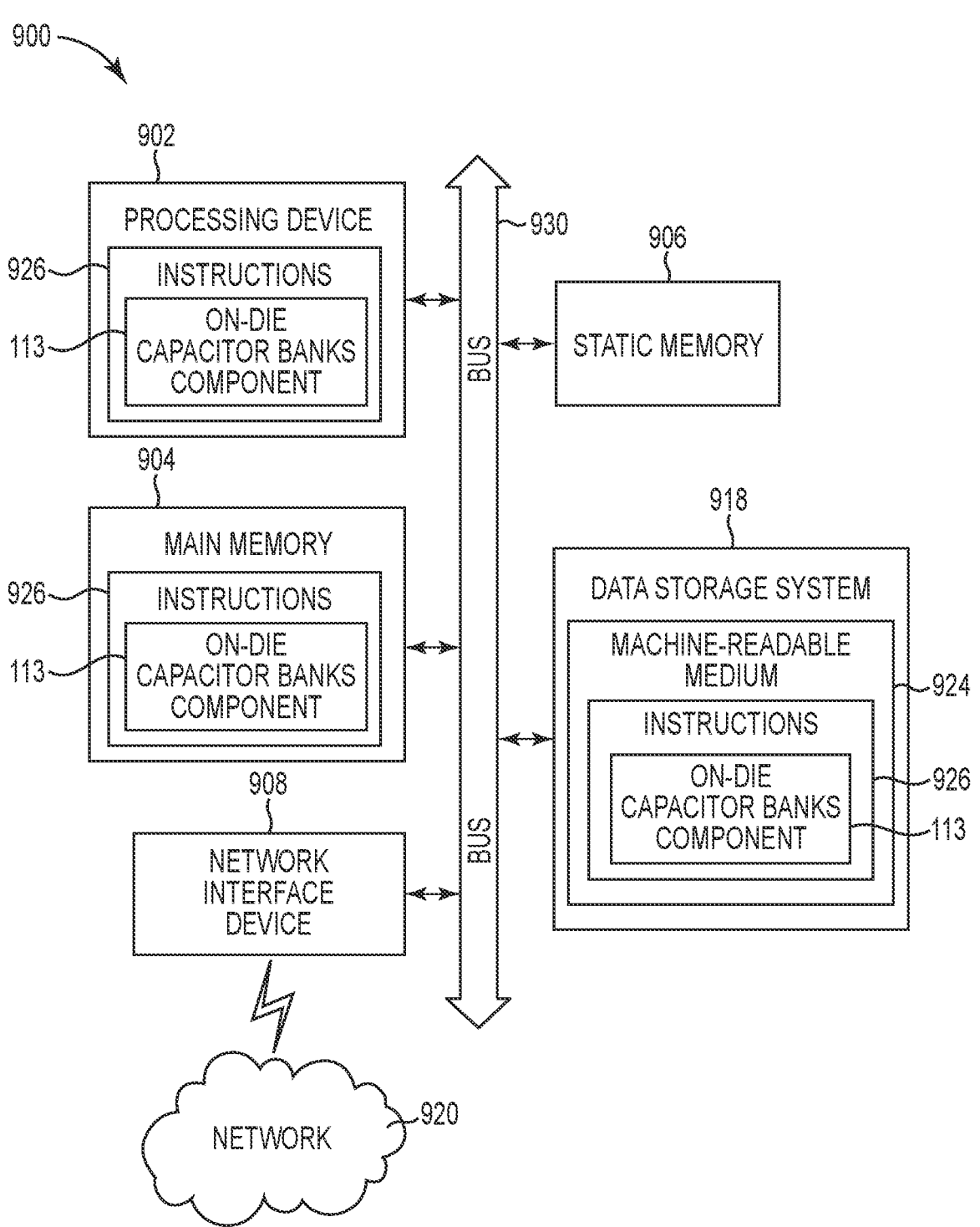
FIG. 9 is a block diagram of an example computer system in which embodiments of the disclosure may operate.

FIG. 9 is a block diagram of an example computer system 900 in which embodiments of the disclosure may operate. For example, FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to to perform operations corresponding to the on-die capacitor banks component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

The processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to an on-die capacitor banks component (e.g., the on-die capacitor banks component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer).

In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
dividing an on-die capacitor of a memory device into a plurality of capacitor banks;
charging the plurality of capacitor banks sequentially during an initialization of the memory device;
determining a supply voltage of a power source for the memory device is below a threshold voltage; and
discharging the plurality of capacitor banks sequentially to provide power to a DC-DC converter coupled to the power source to provide power to the memory device in response to determining the supply voltage is below the threshold voltage.

2. The method of claim 1, wherein charging the plurality of capacitor banks sequentially includes completing a charging of a first capacitor bank of the plurality of capacitor banks prior to starting a charging of a second capacitor bank of the plurality of capacitor banks.

3. The method of claim 1, wherein discharging the plurality of capacitor banks sequentially includes completing a discharging of a first capacitor bank of the plurality of capacitor banks prior to starting a discharging of a second capacitor bank of the plurality of capacitor banks.

4. The method of claim 1, wherein discharging the plurality of capacitor banks includes providing power to a switch associated with the on-die capacitor.

5. The method of claim 4, wherein providing power to the switch includes opening the switch between the supply voltage and the memory device.

6. The method of claim 4, wherein providing power to the switch includes closing the switch between the plurality of capacitor banks and the memory device.

7. The method of claim 1, comprising providing power, via the supply voltage, to the memory device while simultaneously charging the plurality of capacitor banks sequentially during an initialization of the memory device.

8. The method of claim 1, comprising discharging the plurality of capacitor banks sequentially to provide power to a controller of the memory device.

9. An apparatus, comprising:
a substrate comprising:
a capacitor die separated into a plurality of capacitor banks coupled to a power source via a switch;
a plurality of memory dice coupled to the power source and the capacitor die via the switch; and
a controller configured to:
charge the plurality of capacitor banks sequentially;
determine a supply voltage from the power source is below a threshold voltage;

actuate the switch to couple the capacitor die to the plurality of memory dice; and discharge the plurality of capacitor banks sequentially to provide power to a DC-DC converter coupled to the power source to provide power to the plurality of memory dice through the switch.

10. The apparatus of claim 9, wherein the controller is further configured to discharge the plurality of capacitor banks sequentially to provide power to the controller and additional memory devices coupled to the power source.

11. The apparatus of claim 9, wherein the controller is further configured to alter the switch to decouple the power source from the plurality of memory dice.

12. The apparatus of claim 9, wherein the controller is further configured to discharge the plurality of capacitor banks sequentially to provide power to the switch.

13. The apparatus of claim 9, wherein the plurality of capacitor banks are charged sequentially by completing a charge of a first capacitor bank from the plurality of capacitor banks prior to starting a charge of a second capacitor bank from the plurality of capacitor banks until each of the plurality of capacitor banks are charged.

14. The apparatus of claim 9, wherein the plurality of capacitor banks are discharged sequentially by completing a discharge of a first capacitor bank from the plurality of capacitor banks prior to starting a discharge of a second capacitor bank from the plurality of capacitor banks until each of the plurality of capacitor banks are discharged.

15. The apparatus of claim 9, wherein the controller is further configured to complete an initialization of the plurality of memory dice prior to completely charging the plurality of capacitor banks.

16. A system comprising:

a host;

a plurality of memory dice coupled to the host;

a first switch to couple the host to a trenched on-die capacitor die;

a second switch to couple the trenched on-die capacitor die to a controller; and the controller configured to:

identify a plurality of capacitor banks of the trenched on-die capacitor die;

charge the plurality of capacitor banks sequentially utilizing a voltage source provided by the host through the first switch in a first state;

determine a supply voltage from the voltage source is below a threshold voltage;

alter the first switch to a second state to couple the trenched on-die capacitor die to the plurality of memory dice;

close the second switch to couple the plurality of capacitor banks to the controller; and discharge the plurality of capacitor banks sequentially to provide power to the plurality of memory dice through the first switch and provide power to the controller through the second switch.

17. The system of claim 16, wherein the second switch is coupled to a DC-DC converter coupled to the controller.

18. The system of claim 16, wherein the second switch coupled to a capacitive voltage divider of the trenched on-die capacitor die.

19. The system of claim 16, comprising a time delay charging circuit coupled between the first switch and the trenched on-die capacitor die.

* * * * *